United States Patent [19]

Hashimoto et al.

[11] Patent Number: 5,440,454
[45] Date of Patent: Aug. 8, 1995

[54] ELECTRICAL CONNECTING DEVICE AND METHOD FOR MAKING SAME

[75] Inventors: Kaoru Hashimoto; Tatsuo Chiyonobu; Kyoichiro Kawano; Kouji Watanabe, all of Kawasaki, Japan

[73] Assignee: Fujitsu Limited, Kawasaki, Japan

[21] Appl. No.: 277,992

[22] Filed: Jul. 20, 1994

[30] Foreign Application Priority Data

Oct. 14, 1993 [JP] Japan .................. 5-257004

[51] Int. Cl.⁶ ............................... H05K 1/02
[52] U.S. Cl. ..................... 361/790; 361/767; 361/784; 174/260; 174/261; 439/65; 439/74
[58] Field of Search ........... 174/260, 261, 267; 361/790, 784, 767, 771, 768; 439/65, 66, 74, 83, 78

[56] References Cited

U.S. PATENT DOCUMENTS

| | | | |
|---|---|---|---|
| 4,642,889 | 2/1987 | Grabbe | 29/840 |
| 4,706,167 | 11/1987 | Sullivan | 361/406 |
| 4,950,843 | 8/1990 | Hirota | 174/260 |
| 4,963,002 | 10/1990 | Tagusa et al. | 350/336 |
| 5,017,738 | 5/1991 | Tauji et al. | 174/94 |
| 5,088,007 | 2/1992 | Missele | 361/386 |
| 5,219,639 | 6/1993 | Sugawara et al. | 428/209 |

FOREIGN PATENT DOCUMENTS 2-159047  6/1990  Japan .
3-276750  12/1991  Japan .
4-12588   1/1992  Japan .

*Primary Examiner*—Leo P. Picard
*Assistant Examiner*—L. Thomas
*Attorney, Agent, or Firm*—Armstrong, Westerman, Hattori, McLeland & Naughton

[57] ABSTRACT

An electrical connecting device including a first circuit board providing thereon with input/output terminals, each of the terminals having a tip surface coated with gallium and a second circuit board providing thereon with contact terminals, each of the terminals having a tip surface coated with indium or tin. A low-melting point alloy layer is formed by a mutual action between gallium and indium or tin, when the input/output terminals of the first circuit board are in contact with the respective terminals of the second circuit board and electrically connected to each other. The second metal layer includes a plurality of wire-like metal supports extending substantially perpendicular to the surface of the terminal and a low-melting point metal retained by the wire-like metal supports.

10 Claims, 3 Drawing Sheets

ELECTRICAL CONNECTING DEVICE AND METHOD FOR MAKING SAME

BACKGROUND OF THE INVENTION

1. Field of the Invention

The present invention relates to an electrical connecting device and a method for making the same and, more particularly relates to such an electrical connecting device, which can be advantageously used, such as, when a circuit board having a number of very fine electrical contacts in small spaces should be electrically contacted to another circuit board having corresponding electrical contacts. Also, the present invention relates to an electrical connecting device and a method for making the same, in which compact, high density and low contact resistance connection can be achieved without necessity of special force for inserting or removing the circuit boards to or from each other, when they are electrically connected.

2. Description of Related Art

A conventionally known electrical connecting device comprises, in general, a contact pin array referred to as "male contact" or "plug" which is inserted into or removed from spring means referred to as "female contact" or "jack". In this kind of electrical connecting device, when the plug is inserted into the jack, an electrical connection by metal-to-metal contact can be attained due to the mechanical friction between the both members. Although the force exerted by the spring depends on the material or the surface treatment layer of the spring means, the force is to be designed as at least ten and several grams to obtain low and stable contact resistance.

In recent years, in order to obtain a smaller sized and high performance electronic apparatus, such a mounting technique has been widely used that a plurality of elements, such as highly integrated LSIs, chip capacitors, or chip resistors, are mounted on a single circuit board. In these circuit boards, a number of input/output terminals for a single circuit board has been significantly increased. Such input/output terminals are, in general, contact pins (corresponding to plugs) which are fixed to the board by blazing or soldering. Therefore, when these plurality of contact pins are inserted into the jacks or withdrawn from the jacks, a large amount of force is necessary. At most, more than 100 kg is necessary and, therefore, the manually handling is sometimes difficult, the contact pins may be bent, or the blazed or soldered portion may be damaged.

To reduce the inserting and withdrawing force to overcome the above-mentioned problems, a connecting device using an auxiliary means, such as cam actuation mechanism or the like, with no or less inserting force has been recently developed and employed. However, the mount efficiency of the system may be reduced, since the construction of such a device is very complicated and a space for such cam actuation mechanism cannot be ignored.

To overcome these problems, U.S. Pat. No. 5,017,738 discloses an electrical connecting apparatus in which porous silver plating layers are provided on surface pads of a printed circuit board and on a surface of a contact provided on the pads of a mother board. These layers consist of first and second metals which forms an eutectic low-melting point metal when they are come into contact to each other. In Unexamined Patent Publication (kokai) No. 4-12588 discloses an electrical connecting apparatus using easily melting metals, such as indium and gallium, which are in solid state in the room temperature and in liquid state when used at a circuit actuating temperature.

As mentioned above, it has been already known that a metal or alloy which is in liquid state (liquid phase) in the room temperature or adjacent thereto is used as a material of contact. Also, it has been known that, as means for creating a liquid phase, one and the other metals for cooperating to constitute an alloy are formed separately on the contact members, and a liquid phase is created due to metal reaction or diffusion, when they are in contact with each other.

However, according to the above-mentioned solutions, it is relatively difficult to form a metal layer as a contact member on a board. Also, it is difficult to retain the metal for liquid phase on a predetermined position on a circuit board. Therefore, the above-mentioned prior art solutions have some problems in productivity and reliability.

SUMMARY OF THE INVENTION

An object of the present invention is to provide an electrical connecting device and a method for making the same, in which a metal layer as a contact member can easily be formed on a board and the metal for liquid phase can stably retained on a predetermined position on a circuit board to improve the productivity and reliability of such devices.

According to the present invention, there is provided an electrical connecting device comprising: a first circuit board providing thereon with input/output terminals, each of said terminals having a tip surface coated with a first metal layer; a second circuit board providing thereon with contact terminals, each of said terminals having a tip surface coated with a second metal layer; a low-melting point alloy layer being formed by a mutual action of the first and second metals in the respective first and second metal layers, when said input/output terminals of the first circuit board are in contact with the respective terminals of the second circuit board and electrically connected to each other through said low-melting point alloy; and at least one of said first and second metal layers comprising a plurality of wire-like metal supports extending substantially perpendicular to said tip surface of the terminal and a low-melting point metal retained by said wire-like metal supports.

The second metal layer is formed by the following steps of: coating a resist on said tip surface of each of the respective terminals of at least one of said first and second circuit boards; forming a plurality of apertures in said resist so as to extend to the tip surface of the terminal; plating on said resist with a metal, so that plated metal is grown in said respective apertures; removing said resist so that said plated metal remain as a plurality of wire-like metal supports which extend substantially perpendicular to said tip surface of the terminal; and retaining a low-melting point metal to be coated in said wire-like metal supports.

In this invention, it is easy to form the metal layer, in this case, the second layer, can easily be formed on the circuit board, since the second metal layer can be stably retained in the wire-like metal supports.

According to another aspect of the present invention, there is provided with an electrical connecting device comprising: a first circuit board providing thereon with input/output terminals, each of said terminals having a tip surface coated with a first metal layer; a second circuit board providing thereon with contact terminals, each of said terminals having a tip surface coated with a second metal layer; a low-melting point alloy layer being formed by a mutual action of the first and second metals in the respective first and second metal layers, when said input/output terminals of the first circuit board are in contact with the respective terminals of the second circuit board and electrically connected to each other through said low-melting point alloy; and at least one of said first and second metal layers comprising three-dimensional metal structure formed on said tip surface of the terminal and a low-melting point metal retained in said three-dimensional metal structure.

The second metal layer is formed by the following steps of: coating a resist containing paraffin dispersed therein on said surface of each of the respective terminals of at least one of said first and second circuit boards; heating said resist to melt said paraffin; plating on said resist with a metal, so that plated metal is grown, in place of said molten paraffin, to form a three-dimensional metal structure; removing said resist so as to remain said plated metal; and retaining a low-melting point metal to be coated in said three-dimensional metal structure.

In this case, since the second metal layer can be stably retained in the three-dimensional metal structure, it is easy to form the metal layer (i.e., the second layer) can easily be formed on the circuit board.

The first metal layer essentially consists of gallium and the second metal layer comprises indium or tin. The first and second metal layers are preferably formed in such a manner that the low-melting point metal alloy which is to be formed by said first and second metal layers consists of 75.5 weight percent of gallium and 24.5 weight percent of indium, or consists of 92 weight percent of gallium and 8 weight percent of tin.

DETAILED DESCRIPTION OF THE PREFERRED EMBODIMENTS

Figure 1A:
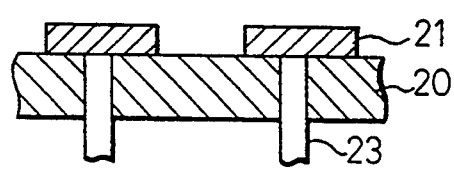
FIGS. 1(a) through 1(f) show respective steps for forming an electrical connecting device according to the first embodiment of this invention.
Figure 1D:
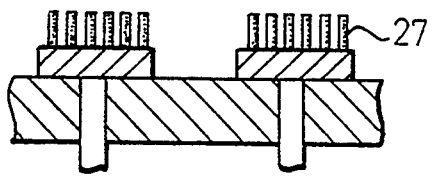
Figure 1B:
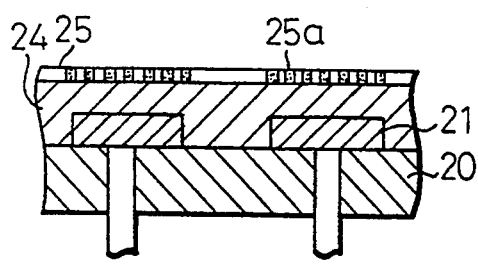
Figure 1E:
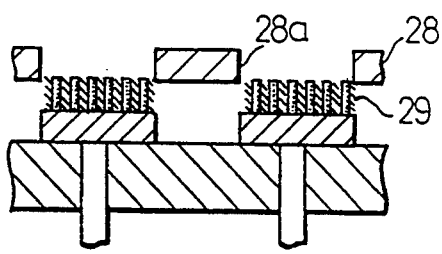
Figure 1C:
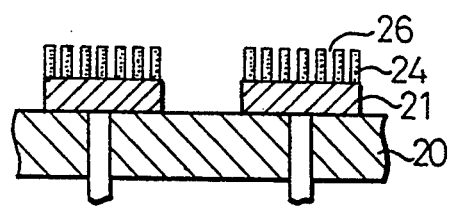
Figure 1F:
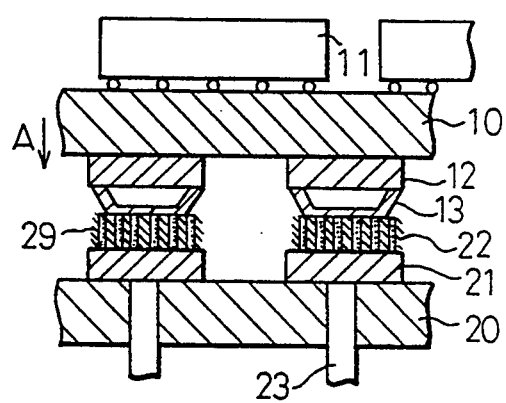

Referring now to the accompanying drawings, wherein FIGS. 1(a) through 1(f) show respective steps for forming an electrical connecting device according to the first embodiment of this invention. In FIG. 1(f), a first circuit board 10 is provided on the upper surface thereon with an electrical element 11, such as a LSI (large-scale integrated circuit) chip 11 of a semiconductor device, by means of any known method. On the lower surface of the circuit board 10 is provided with input and output terminals 12, each having a tip end coated with a film 13 of gallium by, such as a vapor deposition.

On the other hand, a second circuit board or connecting board 20 is provided on the upper surface thereof with connecting terminals 21 which are arranged in conformity with the input and output terminals 12 of the first circuit board 10 so that the terminals 21 are to be electrically connected to the respective terminals 12 of the first circuit board 10. A metal coating film 22 consisting of indium or tin is formed on the surface of the respective terminals 21 by means of a method as will be mentioned such as mentioned below.

Thus, if the first circuit board 10 is moved downward as shown by an arrow A, the input/output terminals 12 of the first circuit board 10 come into contact with the respective terminals 21 of the second circuit board 20 and electrically connected thereto. As discussed hereinafter more detail, the gallium film 13 and the metal coating film 22 made of indium or tin are mutually contact therewith and cooperate to generate a low-melting point alloy layer by mutually acting therebetween. Thus, the both terminals 12 and 21 are electrically connected to each other via the low-melting point alloy layer.

Figure 2:
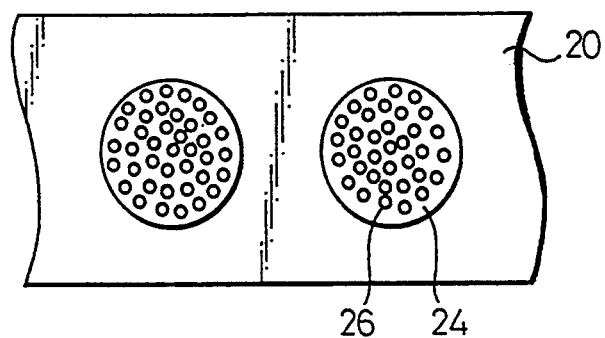
FIG. 2 is a plan view seen from the top of FIG. 1(c)

The metal coating film 22 made of indium or tin formed on the surface of the terminal 21 of the second circuit board 20 is formed by a method as shown in FIGS. 1(a) through 1(e). First of all, as shown in FIG. 1(a), a plurality of terminals 21 are formed on the second circuit board 20 by any known method and leads 23 are attached to the board 20 so as to pass through the board 20 and contact with the terminals 21. In FIG. 1(b), the surface of the second circuit board 20 containing the terminals 21 is coated with photoresist to a predetermined thickness thereof. A photo-mask 25 having a plurality of exposed portions 25a at the areas corresponding to the terminals 21 is placed on the top of this photoresist 24. Then, the photoresist is exposed to patternwise exposure of light or high energy beam, such as electron beam or Xray. The diameter of the exposed portions 25a is 50 μm and the pitch therebetween is 80 82 m. Thus, the photoresist 24 only on the exposed portions 25a are removed and the photoresist 24 on the other unexposed portions are remained. Therefore, a pattern of holes 26 having the diameter thereof being 50 μm and the pitch therebetween being 80 μ m are formed, as shown in FIGS. 1(c) and 2.

The second circuit board 20 is dipped into the electroless nickel plating bath (not shown in the drawings) and a flow of plating liquid toward the second circuit board 20 is created in the bath, so that the nickel plated layer 27 is grown within the plurality of holes 26. Then, if the photoresist 24 is removed or peeled off, a large number of terminals 27 of the wire-like grown plated nickel are obtained, as shown in FIG. 1(d). Then, indium is vapor-deposited onto the second circuit board 20, using a mask 28 having openings 28a arranged at positions corresponding to the positions of the wire-like grown plated nickel 27, as shown in FIG. 1(e). Thus, a large number of nickel wire 27 can be inserted in the indium.

Then, as mentioned above, as shown in FIG. 1(f), the gallium films 13 formed on the input/output terminals 12 of the first circuit board 10 come into contact with the metal coating layers 22 in which indium 29 is retained by a number of nickel wires 27, so that liquid phases of Ga-In are created and thus both terminals 12 and 21 are electrically connected to each other.

The amount of indium 29 is calculated by reducing the volume of the nickel wires from the volume of the openings 28a of the mask 28. A predetermined amount of indium thus calculated should be filled in the crucible of a vapor-deposition apparatus (not shown) and all of the indium in the crucible is completely evaporated, so that the amount of indium can be regulated. On the other hand, the amount of gallium is determined automatically, if the amount of indium is determined. For example, if an eutectic composition should be obtained, the amount of gallium being 75.5 weight percent and the amount of indium being 24.5 weight percent. Thus, the gallium is adhered to the terminals by vaporizing, sputtering or the like. Tin can also be used in place of indium 29 and tin-films can be formed in the same manner as the above. In this case, the same effects can also be obtained. However, in this case, the amounts of indium and tin should be determined in such a manner that an eutectic composition should be obtained, wherein the amount of gallium being 92 weight percent and the amount of tin being 8 weight percent.

Figure 3A:
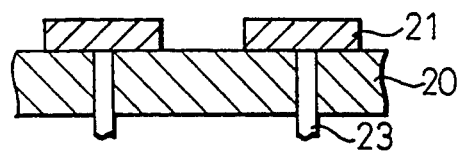
FIGS. 3(a) through 3(e) show respective steps for forming an electrical connecting device according to the second embodiment of this invention.
Figure 3B:
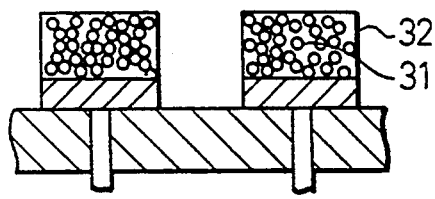
Figure 3C:
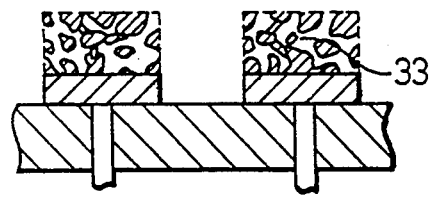
Figure 3D:
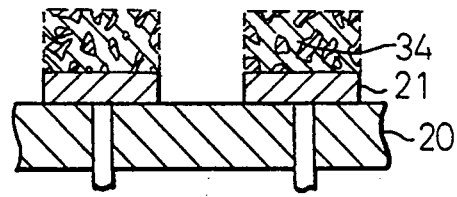

FIGS. 3(a) to 3(e) show a process of the second embodiment of a method for making an electrical connecting apparatus according to the present invention. First of all, FIG. 3(a) a second circuit board 20 having a plurality of connecting terminals 21 and lead terminals 23 in the same manner as FIG. 1(a). In FIG. 3(b), a predetermined thickness of photoresist 32 in which paraffin 31 is dispersed is coated on the surface of the portions of the terminals 21 of the second circuit board 20. Then, the photoresist 32 is baked. As shown in FIG. 3(c) and enlarged view of FIG. 4, the paraffin 31 becomes to be melted to form a plurality of apertures (or cavities) 33. Thus, the amount of paraffin should be adjusted in advance in such a manner that these apertures are mutually communicated with each other.

The second circuit board 20 is dipped into the electroless nickel plating bath (not shown in the drawings) and a flow of plating liquid toward the surface of the terminals 21 of the second circuit board 20 is created in the bath, so that the nickel plated layer 34 is grown within the plurality of apertures 33 mutually communicated with each other. Then, if the photoresist 32 is removed or peeled off, a large number of terminals 34 of the plated nickel are obtained to form a net-like or three-dimensional configuration.

Figure 5:
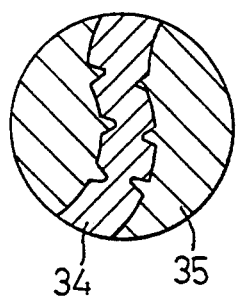
FIG. 5 is a partial enlarged view of FIG. 3(d).

Although not illustrated in the drawings, in the same manner as the first embodiment, indium 35 is evaporated to the second circuit board 20, using a mask 28 having openings 28a arranged at positions corresponding to the positions of the plated nickel, as shown in FIG. 1(e). Thus, as shown in the enlarged view of FIG. 5, indium 35 is retained on the net-like plated nickel 34.

Figure 3E:
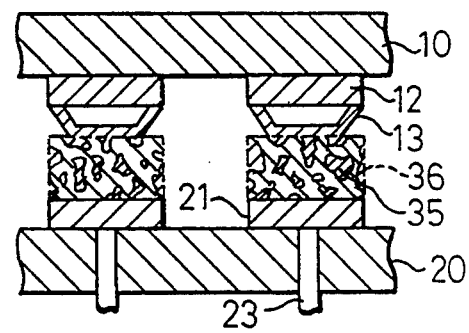
Figure 4:
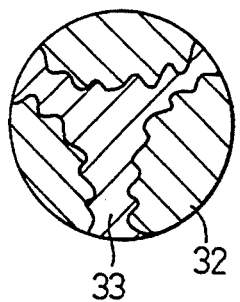
FIG. 4 is a partial enlarged view of FIG. 3(c)

Then, in the quite same manner as the above-mentioned first embodiment, as shown in FIG. 3(e), the gallium films 13 formed on the input/output terminals 12 of the first circuit board 10 come into contact with the metal coating layers 36 in which indium 35 is retained by the plated nickel 34, so that liquid phases of Ga-In are created and thus both terminals 12 and 21 are electrically connected to each other, in the same manner as the above embodiment.

In an alternative embodiment, it is possible to relatively simply and directly obtain terminals in which plated nickel exists net-like configuration by electroless plating using an electroless plating liquid containing paraffin dispersed on the portions of the pattern or terminal 21 of the second circuit board 20. In the same manner as the second embodiment, by heating the second circuit board 20, the paraffin is melted and removed and then, in place of paraffin, indium or tin is attached thereto by vapor-deposition.

Also, as a method for adhering indium or tin, in place of vapor-deposition, an electroless plating method can also be used. In this case, however, it is necessary that the respective terminals are electrically connected to each other.

According to the present invention, it is possible to easily obtain the metal coated layer in which a liquid phase of eutectic alloy can be created by mutually contacting with respect to each other and an electrical connecting device in which the metal plated layer is stably retained on the connecting terminals 21. Thus, when the terminals 12, 21 of the first and second circuit boards 10, 20 are to be mutually connected to each other, it is possible to greatly reduce the force for manually inserting or removing the input/output terminals.

It should be understood by those skilled in the art that the foregoing description relates to only a preferred embodiment of the disclosed invention, and that various changes and modifications may be made to the invention without departing from the spirit and scope thereof.

We claim:

1. An electrical connecting device comprising:
   a first circuit board providing thereon with input/output terminals, each of said terminals having a tip surface coated with a first metal layer;
   a second circuit board providing thereon with contact terminals, each of said terminals having a tip surface coated with a second metal layer;
   a low-melting point alloy layer being formed by a mutual action of metals in the respective first and second metal layers, when said input/output terminals of the first circuit board are in contact with the respective terminals of the second circuit board and electrically connected to each other through said low-melting point alloy; and
   at least one of said first and second metal layers comprising a plurality of wire-like metal supports extending substantially perpendicular to said tip surface of the terminal and a low-melting point metal retained by said wire-like metal supports.

2. A device as set forth in claim 1, wherein said first metal layer essentially consists of gallium and said second metal layer comprises said plurality of wire-like metal supports and indium or tin retained in said supports.

3. A device as set forth in claim 2, wherein said low-melting point alloy consists of 75.5 weight percent of gallium and 24.5 weight percent of indium.

4. A device as set forth in claim 2, wherein said low-melting point alloy consists of 92 weight percent of gallium and 8 weight percent of tin.

5. A device as set forth in claim 1, wherein said wire-like metal supports are made of electroless or electoplating metal.

6. An electrical connecting device comprising:
   a first circuit board providing thereon with input/output terminals, each of said terminals having a tip surface coated with a first metal layer;
   a second circuit board providing thereon with contact terminals, each of said terminals having a tip surface coated with a second metal layer;
   a low-melting point alloy layer being formed by a mutual action of metals in the respective first and second metal layers, when said input/output terminals of the first circuit board are in contact with the respective terminals of the second circuit board and electrically connected to each other through said low-melting point alloy; and
   at least one of said first and second metal layers comprising three-dimensional metal structure formed on said tip surface of the terminal and a low-melting point metal retained in said three-dimensional metal structure.

7. A device as set forth in claim 6, wherein said first metal layer consists essentially of gallium and said second metal layer comprises said three-dimensional metal structure and indium or tin retained in said three-dimensional metal structure.

8. A device as set forth in claim 7, wherein said low-melting point alloy consists of 75.5 weight percent of gallium and 24.5 weight percent of indium.

9. A device as set forth in claim 7, wherein said low-melting point alloy consists of 92 weight percent of gallium and 8 weight percent of tin.

10. A device as set forth in claim 6, wherein said three-dimensional metal structure is made of electroless or electro-plating metal.

* * * * *